US009778674B2

(12) United States Patent
Cai

(10) Patent No.: US 9,778,674 B2
(45) Date of Patent: Oct. 3, 2017

(54) METHOD AND MOBILE TERMINAL FOR CORRECTING POWER OF MOBILE TERMINAL

(71) Applicant: ZTE Corporation, Shenzhen, Guangdong (CN)

(72) Inventor: Xiaoguang Cai, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 179 days.

(21) Appl. No.: 14/426,285

(22) PCT Filed: Jun. 21, 2013

(86) PCT No.: PCT/CN2013/077720
§ 371 (c)(1),
(2) Date: Mar. 5, 2015

(87) PCT Pub. No.: WO2013/170804
PCT Pub. Date: Nov. 21, 2013

(65) Prior Publication Data
US 2015/0220103 A1 Aug. 6, 2015

(30) Foreign Application Priority Data
Sep. 21, 2012 (CN) .......................... 2012 1 0355152

(51) Int. Cl.
G05F 5/00 (2006.01)
G01R 31/36 (2006.01)
(Continued)

(52) U.S. Cl.
CPC ............... *G05F 5/00* (2013.01); *G01R 22/02* (2013.01); *G01R 31/3606* (2013.01);
(Continued)

(58) Field of Classification Search
CPC ....... G01R 22/02; G01R 31/3606; G05F 5/00; H02J 7/0021; H02J 7/0073; H02J 7/0078; H02J 2007/0096
(Continued)

(56) References Cited

U.S. PATENT DOCUMENTS 3,652,917 A 3/1972 Biggs
4,949,046 A 8/1990 Seyfang
(Continued)

FOREIGN PATENT DOCUMENTS

CN 101382584 A 3/2009
CN 102014213 A 4/2011
(Continued)

OTHER PUBLICATIONS

Supplementary European Search Report in European application No. 13790785.3, mailed on Jul. 30, 2015.
(Continued)

Primary Examiner — Kyle J Moody
(74) Attorney, Agent, or Firm — Oppedahl Patent Law Firm LLC

(57) ABSTRACT

A method and mobile terminal for correcting the power of a mobile terminal is provided, including reading the register of a coulometer chip for acquiring a first power of a battery; matching the first power with a preset power level, each of power levels corresponding to a preset service logic; correcting the first power by a preset service logic matched with the first power to form and display a second power. In this way, it is only necessary to compensate the actual power according to a certain criterion to acquire a second power after the acquisition of the actual power, without need of adding additional devices or changing hardware arrange-
(Continued)

ment in a hardware system, thereby enabling a user to use battery power as much as possible, and reducing unnecessary charging operations.

7 Claims, 4 Drawing Sheets

(51) Int. Cl.
 *H02J 7/00* (2006.01)
 *G01R 22/02* (2006.01)
(52) U.S. Cl.
 CPC .......... *H02J 7/0021* (2013.01); *H02J 7/0073* (2013.01); *H02J 7/0078* (2013.01); *H02J 2007/0096* (2013.01)
(58) Field of Classification Search
 USPC .................... 323/283, 299; 702/63; 320/162
 See application file for complete search history.

(56) References Cited

U.S. PATENT DOCUMENTS

| | | | |
|---|---|---|---|
| 5,440,221 A | 8/1995 | Landau | |
| 5,808,445 A | 9/1998 | Aylor | |
| 6,191,557 B1 * | 2/2001 | Gray | G01R 31/3682 320/132 |
| 7,392,099 B2 * | 6/2008 | Atkinson | G06F 1/3203 323/350 |
| 2008/0097544 A1 | 4/2008 | Gandhi | |
| 2012/0105014 A1 * | 5/2012 | Nakayama | G01R 31/3651 320/162 |
| 2012/0116471 A1 | 5/2012 | Gandhi | |
| 2012/0185190 A1 | 7/2012 | Okumura | |
| 2012/0185193 A1 | 7/2012 | Nieddu | |
| 2014/0214107 A1 | 7/2014 | Gandhi et al. | |

FOREIGN PATENT DOCUMENTS

| | | |
|---|---|---|
| CN | 102298119 A | 12/2011 |
| EP | 0225106 A1 | 6/1987 |
| JP | 2005080376 A | 3/2005 |
| WO | 2011013248 A1 | 2/2011 |

OTHER PUBLICATIONS

International Search Report in international application No. PCT/CN2013/077720, mailed on Aug. 29, 2013.
English Translation of the Written Opinion of the International Search Authority in international application No. PCT/CN2013/077720, mailed on Aug. 29, 2013.

* cited by examiner

METHOD AND MOBILE TERMINAL FOR CORRECTING POWER OF MOBILE TERMINAL

TECHNICAL FIELD

The disclosure relates to a technology of battery supply, and in particular to a method and mobile terminal for correcting a power of a mobile terminal.

BACKGROUND

With the rapid development of communication and microelectronics technologies, mobile terminals have more and more functions, a plurality of which have high power consumption. Most of terminals at present use a lithium ion battery, and due to the small capacity of such battery, it comes to a practical contradiction between high consumption and battery capacity of the mobile terminal.

A smart mobile terminal uses a coulometer chip to acquire the voltage and residual power of a battery, reads the coulometer chip by software and displays it on an interface in real time. A user is reminded when the power goes below a certain value, for example, 15%.

A problem presented in the prior art is that a user usually charges a battery once the power is at a low value, which makes a considerable portion of residual capacity in the battery wasted without any use.

SUMMARY

The embodiments provide a method and mobile terminal for correcting a power of a mobile terminal, to help a user to increase the efficiency of power usage through power correction when there is limited battery capacity.

In order to solve the technical problem discussed above, the disclosure provides a method applied to a mobile terminal which employs a battery as energy supply; the method includes: step 1, reading a register of a coulometer chip for acquiring a first power of the battery; step 2, matching the first power with a preset power level, each of power levels corresponding to a preset service logic; step 3, correcting the first power by a preset service logic matched with the first power to form a second power and display the second power.

The method may include step 4, informing an upper layer of the second power after the correction and displaying the second power on an interface of the mobile terminal.

In the method, step 3 may further include: reading the register of the coulometer chip for acquiring a first voltage of the battery when the first power is at a lowest level of the power levels; filtering the first voltage to form a second voltage; correcting the first power using the second voltage to form the second power.

In the method, the step of reading the register of the coulometer chip for acquiring a first voltage of the battery may include a filtering step, which includes: reading the first voltage of the battery continuously and repeatedly, sorting values of various first voltages, removing the largest value and the smallest value, averaging remaining values, and taking the mean value as the value of the second voltage.

In the method, the preset service logic may include: service logic 1 that is if the first power (C1)≥100%, the first power being at power level 1, then the second power (C2)=100%; service logic 2 that is if 100%>the C1≥30%, the first power being at power level 2, then the C2=(50+((C1*100−30)*5)/7)%; service logic 3 that is if 30%>the C1≥7%, the first power being at power level 3, then the C2=(14+((C1*100−7)*35)/22)%; service logic 4 that is 7%>the C1≥2%, the first power being at power level 4, then the C2=((C1*100*13)/6)%.

In the method, service logic 5 is that when the first power is lower than or equal to 2%, and is at the lowest level of power level, if the second voltage is higher than a voltage threshold, then the C2=1%; if the second voltage is not higher than the voltage threshold, then the C2=0%, and an operation system is informed to start and execute a shutdown process.

A mobile terminal is provided, which includes a battery, and further includes: a power acquisition unit, configured to read a register of a coulometer chip for acquiring a first power of the battery; a power level unit, configured to match the first power with a preset power level, each of power levels corresponding to a preset service logic; a power correction unit, configured to correct the first power by a preset service logic matched with the first power to form and display a second power.

In the mobile terminal, the power correction unit may include a voltage correcting power unit, configured to read the register of the coulometer chip for acquiring a first voltage of the battery when the first power is at the lowest level of the power level; to filter the first voltage to form a second voltage; and to correct the first power using the second voltage to form the second power.

In the mobile terminal, the power correction unit may include voltage acquisition unit coupled with the voltage correcting power unit, configured to read the first voltage of battery continuously and repeatedly, sort the values of various first voltages, remove a largest value and a smallest value, average remaining values, and take the mean value as the value of the second voltage.

The mobile terminal may further include a first service logic module configured to perform a process that if the C1≥100%, the first power being at power level 1, then the C2=100%; a second service logic module configured to perform a process that if 100%>the C1≥30%, the first power being at power level 2, then the C2=(50+((C1*100−30)*5)/7)%; a third service logic module configured to perform a process that if 30%>the C1≥7%, the first power being at power level 3, then power C2=(14+((C1*100−7)*35)/22)%; a fourth service logic module configured to perform a process that if 7%>the C1≥2%, the first power being at power level 4, then power C2=((C1*100*13)/6)%; a fifth service logic module configured to perform a process that when the first power is lower than or equal to 2%, and when the first power is at the lowest level, if the second voltage is higher than the voltage threshold, then power C2=1%; if the second voltage is not higher than the threshold, then the C2=0% and an operation system is informed to start and execute a shutdown process.

The beneficial effect of the technical solution of the disclosure is that: without need of adding additional devices or changing hardware arrangement in hardware system, it is merely necessary to compensate the actual power according to a certain criterion to acquire a second power after the acquisition of the actual power, which enables a user to view a power more than actual power when a voltage is high, leads the user to use battery power as much as possible, and thus reduces unnecessary charging operations.

DETAILED DESCRIPTION

The technical problems to be solved, technical solutions and advantages of the disclosure will be described more clearly with reference to embodiments and accompanying drawings.

In an embodiment of the disclosure, a coulometer chip is used for acquiring the voltage and residual power of a battery; the actual power is corrected according to a certain service logic after the actual power is acquired from the coulometer chip, and the power at different levels is provided with corresponding compensation.

Figure 1:
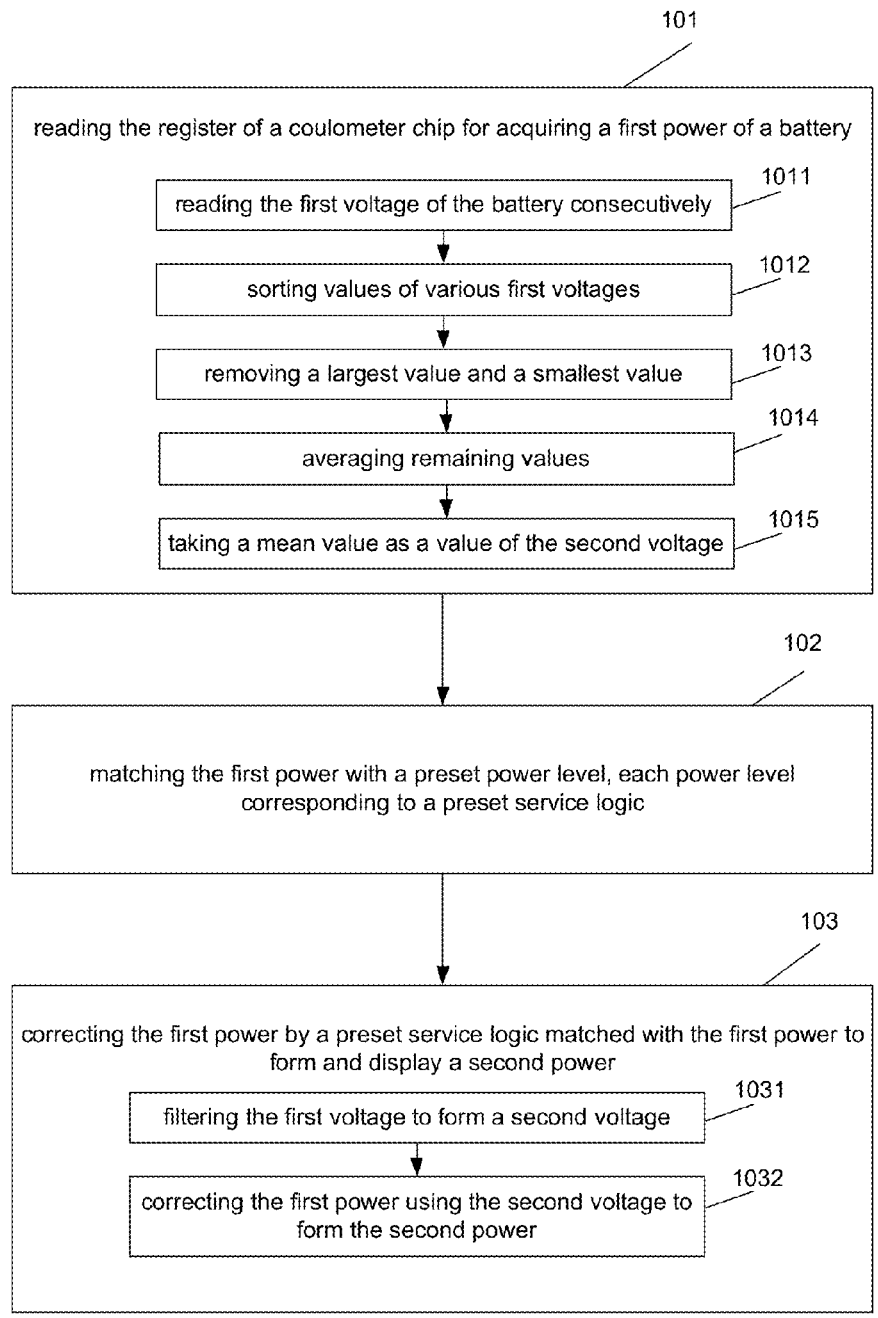
FIG. 1 is a flow chart of a method for correcting a power of a mobile terminal in an embodiment of the disclosure.

An embodiment of the disclosure relates to a method for correcting a power of a mobile terminal, as shown in FIG. 1, the method includes:

Step 101, reading the register of a coulometer chip for acquiring first power of a battery;

Step 102, matching the first power with a preset power level, wherein each power level corresponding to a preset service logic;

Step 103, correcting the first power by a preset service logic matched with the first power to form and display a second power.

With the technology provided in embodiment of the disclosure, it is merely necessary to compensate the actual power after reading the actual power from a coulometer according to a certain criterion to acquire a second power to be displayed, without need of adding additional devices or changing hardware arrangement in a hardware system, such that a user could view the power which is more than the actual power in the high voltage phase, making the user consume the power as much as possible, thereby reducing unnecessary charging operations.

In practical applications, the register of the coulometer chip can be read periodically for acquiring the first power of battery. The specific duration of each cycle can be preset.

Figure 2:
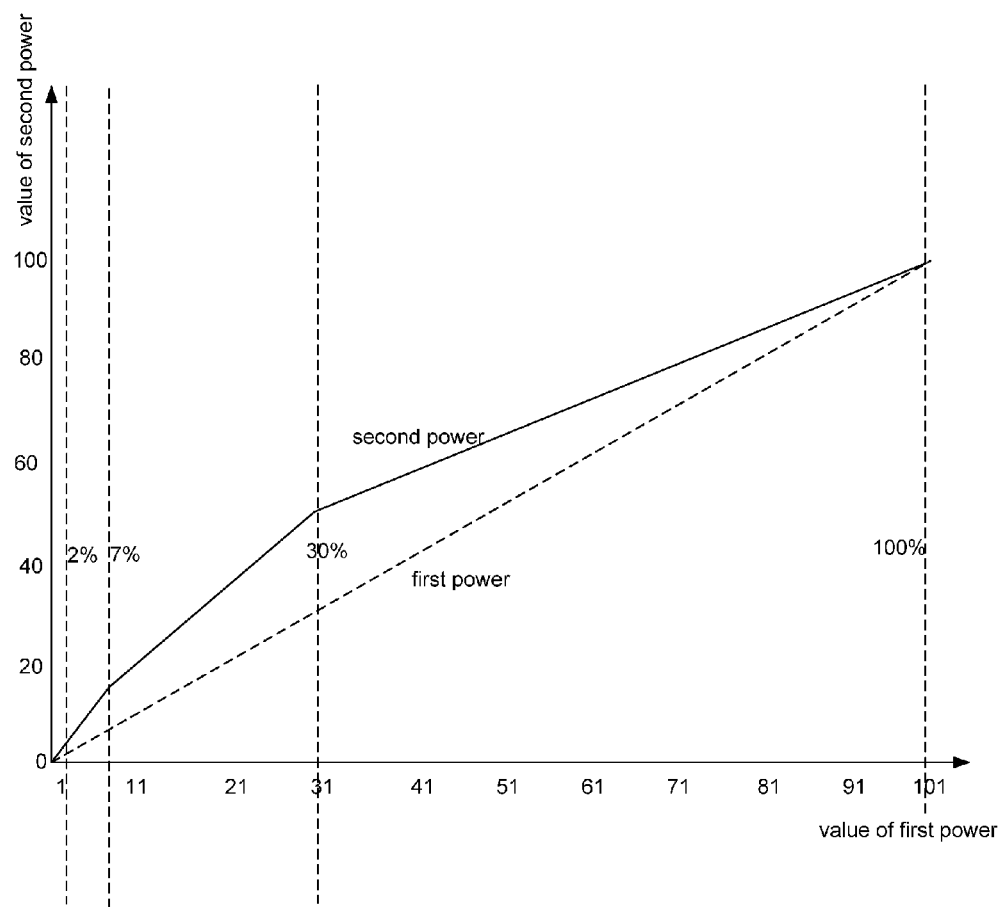
FIG. 2 is a schematic diagram illustrating battery discharge curves before and after the correction in an embodiment of the disclosure.

The relation between the second power and the first power is that the first power is actual power of the battery, and is also the value acquired by reading the register of coulometer chip; the second power is a modified virtual power, which is different from the actual power and is not necessarily equal to the current actual power; as shown in FIG. 2, the second power is kept greater than the first power in the region in which the first power is greater than 2%, at this moment, the second power seen by the user is a value greater than the actual power, thus the possibility of instant charging by the user is reduced and the power currently stored in the battery can be used as much as possible.

In an embodiment, the displaying in step 103 includes:

informing an upper layer of the corrected second power and displaying the corrected second power on the interface of the mobile terminal.

In another embodiment, step 103 also includes:

reading the register of the coulometer chip for acquiring a first voltage of the battery when the first power is at the lowest level of the power level;

filtering 1031 the first voltage to form a second voltage; and correcting 1032 the first power using the second voltage to form a second power.

After correcting the first power using the second voltage to form a second power, step 103 further includes: informing the upper layer of the corrected second power and displaying the corrected second power on the interface of the mobile terminal.

In one embodiment, reading the register of the coulometer chip for acquiring the first voltage of the battery and filtering the first voltage to form a second voltage includes:

reading 1011 the first voltage of the battery continuously and repeatedly, sorting 1012 the values of various first voltages, removing 1013 the largest value and the smallest value, averaging 1014 the remaining values, and taking 1015 the mean value as the value of the second voltage.

Specifically, the voltage of the battery is continuously read for 6 times, these 6 values are sorted, the largest value and the smallest value are removed, the remaining 4 values are averaged, and the mean value is taken as the value of the second voltage. The influence brought by voltage fluctuation could be greatly reduced after this filtering.

In one embodiment, as shown in FIG. 2, the preset service logic includes:

service logic 1, the $C1 \geq 100\%$, the first power being at power level 1, then the $C2=100\%$;

service logic 2, $100\% > \text{the } C1 \geq 30\%$, the first power being at power level 2, then $C2=(50+((C1*100-30)*5)/7)\%$;

service logic 3, $30\% > \text{the } C1 \geq 7\%$, the first power being at power level 3, then the $C2=(14+((C1*100-7)*35)/22)\%$;

service logic 4, $7\% > \text{the } C1 \geq 2\%$, the first power being at power level 4, then the $C2=((C1*100*13)/6)\%$.

Since the fluctuation of battery voltage could be great when the power is low, if applications with high power consumption are running on the mobile terminal at this time, there would be an instant drop-off of battery voltage to a lower value, which would make the hardware of the mobile terminal powered down and damaged, therefore particular operations should be carried out when the power is below 2%.

In one embodiment, service logic 5 is further included;

when the first power is lower than or equal to 2%, and the first power is at the lowest level of the power levels, if the second voltage is higher than a voltage threshold, then the $C2=1\%$, if the second voltage is not higher than the voltage threshold, then the $C2=0\%$, and the operation system is informed to start and execute the shutdown process.

Specifically, the first power is corrected using a filtered battery voltage, that is, the second voltage. It is 1% which will be reported and displayed if the voltage value is higher than a certain value, for example, 3.4V. It is 0% which will be reported if the voltage value is lower than the value, the shutdown process will be started then.

In comparison between service logic 4 and service logic 5:

service logic 4 involves a compensation process when $7\% > \text{the } C1 > 2\%$, where the first power is at power level 4, then the $C2=((C1*100*13)/6)\%$;

service logic 5 involves the compensation process when the first power is lower than or equal to 2%, including:

estimating the second voltage;

assigning 1% to the C2 if the second voltage is higher than the voltage threshold, assigning 0% to the C2 if the second voltage is not higher than the voltage threshold, and notifying the operation system to start and execute the shutdown process.

In one embodiment, reading the register of the coulometer chip periodically specifically includes:

reading periodically using a kernel thread, the period of the reading lasting 10 s.

It is merely necessary to add a compensation process, without adding additional devices or changing hardware arrangement in a hardware system; the power read from the coulometer will be compensated according to a certain criterion to have the power curve corrected, particularly to display more power in the high voltage phase, so as to lead the user to use current power as much as possible. In order to prevent the mobile terminal at low battery from powering down caused by battery voltage drop-off due to applications with great power consumption, it is necessary to correct the power using a filtered voltage when the actual power is lower than 2%.

Figure 3:
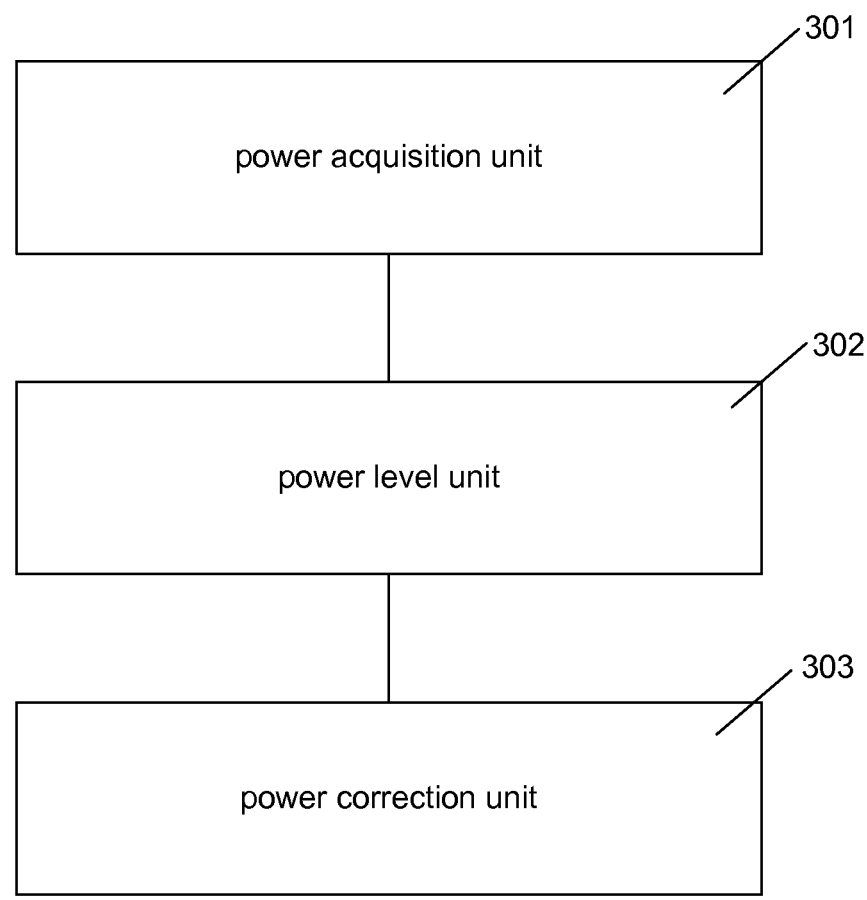
FIG. 3 is a schematic structural diagram of a mobile terminal in an embodiment of the disclosure.
Figure 4:
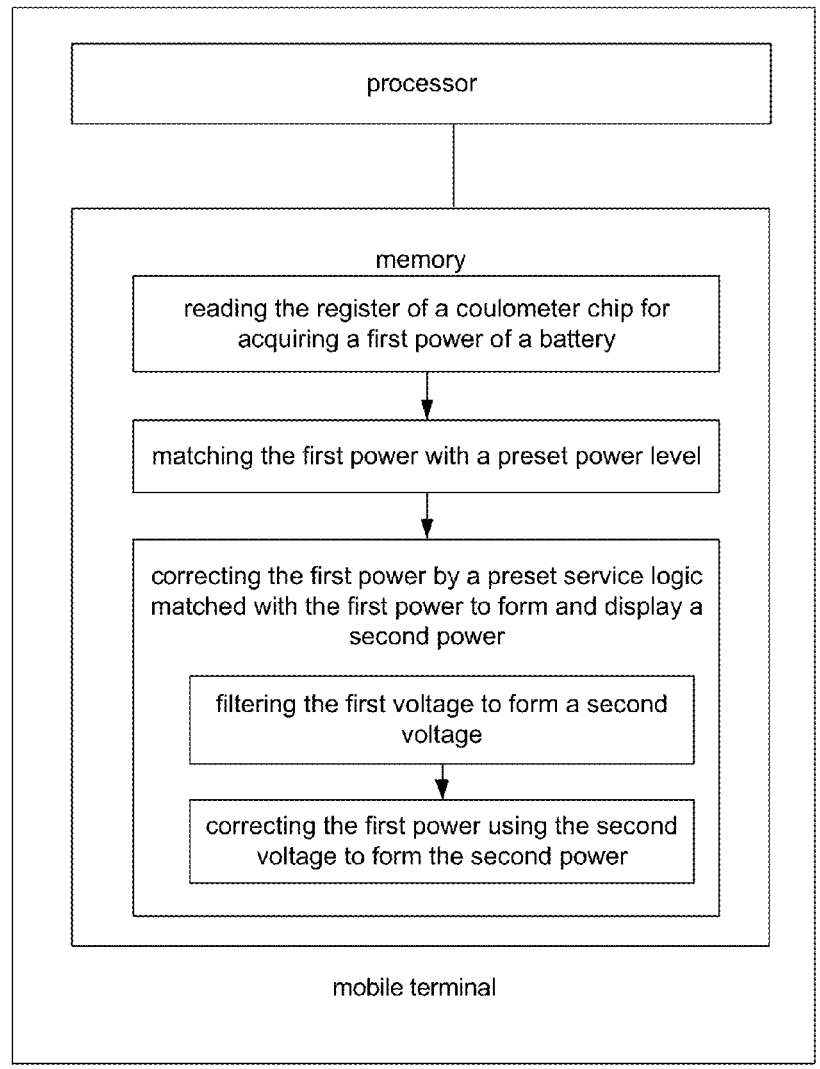
FIG. 4 is another schematic structural diagram of a mobile terminal in an embodiment of the disclosure.

An embodiment of the disclosure provides a mobile terminal including a battery, as shown in FIG. 3, and further including:

a power acquisition unit 301, configured to read a register of a coulometer chip for acquiring first power of the battery;

a power level unit 302, configured to match the first power with a preset power level, each power level corresponding to a preset service logic;

a power correction unit 303, configured to correct the first power by the preset service logic matched with the first power to form a second power and displaying the second power.

The first power is the actual power of the battery and is also a value which can be acquired by reading the register of the coulometer chip; the second power is a corrected virtual power which is different from the actual power and is not necessary to be the same as the current actual power of the battery; as shown in FIG. 2, the second power is kept greater than the first power in the region where the first power is higher than 2%, at which moment the second power viewed by the user is a value greater than the actual power, thus the possibility of instantly charging by the user is reduced, and the user will use current power as much as possible.

In one embodiment, the power correction unit 303 includes:

a voltage correcting power unit, configured to read the register of the coulometer chip for acquiring a first voltage of the battery when the first power is at the lowest level of the power levels; to filter the first voltage to form a second voltage; and correct the first power using the second voltage to form a second power.

In one embodiment, the power correction unit 303 includes:

a voltage acquisition unit coupled with the voltage correcting power unit, configured to read the first voltage of the battery continuously and repeatedly, sort the values of various first voltages, remove the largest value and the smallest value, average the remaining values, and take the mean value as the value of the second voltage.

In one embodiment, the power level unit 302 includes:

a first service logic module configured to perform a process that if the C1≥100%, the first power being at power level 1, then the C2=100%;

a second service logic module configured to perform a process that if 100%>the C1≥30%, the first power being at power level 2, then the C2=(50+((C1*100−30)*5)/7)%;

a third service logic module configured to perform a process that if 30%>the C1≥7%, the first power being at power level 3, then the C2=(14+((C1*100−7)*35)/22)%;

a fourth service logic module configured to perform a process that if 7%>the C1≥2%, the first power being at power level 4, then the C2=((C1*100*13)/6)%;

a fifth service logic module configured to perform a process that when the first power is lower than or equal to 2%, the first power is at the lowest level of power levels, if the second voltage is higher than the voltage threshold, then the C2=1%, if the second voltage is not higher than the voltage threshold, then the C2=0%, and the operation system is informed to start and execute the shutdown process.

The advantage of the technical solution of the disclosure lies in that a compensation process is added but without need of adding additional devices or changing hardware arrangement in a hardware system; after the first power, i.e. the actual power is acquired, the first power is compensated according to a certain criterion to acquire a second power; more power is displayed when voltage is higher, so as to lead the user to consume current power as much as possible, which reduces the charging operations and improves efficient utilization of the battery.

In order to prevent a mobile terminal at lower battery from powering down caused by battery voltage drop-off due to great power consumption by applications, it is necessary to correct the power using a filtered voltage when the actual power is lower than 2% in order to acquire the second power, where the second power can remind the user to charge as soon as possible.

What described above are only embodiments of the disclosure, it should be noted that, any improvements and modifications could be made by those skilled in the art without going beyond the principle of the disclosure; these improvements and modifications should fall within the scope of the disclosure.

What is claimed is:

1. A method for correcting power of a mobile terminal which employs a battery as an energy supply, comprising:
    reading a register of a coulometer chip for acquiring a first power of the battery;
    matching the first power with at least one preset power level, respectively, each of the at least one power level corresponding to a preset service logic;
    correcting the first power by a preset service logic matched with the first power to form a second power and displaying the second power;
    wherein the forming the second power comprises: reading the register of the coulometer chip for acquiring a first voltage of the battery when the first power is at a lowest level of the at least one power level; filtering the first voltage to form a second voltage; and correcting the first power using the second voltage to form the second power;
    wherein the reading the register of the coulometer chip for acquiring the first voltage of the battery when the first power is at a lowest level of the at least one power level comprises: reading the first voltage of the battery consecutively, sorting values of various first voltages, removing a largest value and a smallest value, averaging remaining values, and taking a mean value as a value of the second voltage.

2. The method according to claim 1, wherein the displaying the second power comprises:
    displaying the second power on an interface of the mobile terminal.

3. The method according to claim 1, wherein the preset service logic matched with the first power comprises service logic 1 to 4, wherein:

service logic 1 represents that: if the first power 1 (C1) ≥100%, the first power being at power level 1, then the second power (C2)=100%;

service logic 2 represents that: if 100%>the C1≥30%, the first power being at power level 2, then the C2=(50+((C1*100−30)*5)/7)%;

service logic 3 represents that: if 30%>the C1≥7%, the first power being at power level 3, then the C2=(14+((C1*100−7)*35)/22)%; and service logic 4 represents that: if 7%>the C1≥2%, the first power being at power level 4, then the C2=((C1*100*13)/6)%.

4. The method according to claim 3, wherein the preset service logic matched with the first power also comprises service logic 5, which represents that:

when the first power is lower than or equal to 2%, and is at the lowest level of the at least one power level, if a second voltage is higher than a voltage threshold, then the C2=1%, if a second voltage is not higher than the voltage threshold, then the C2=0%, and an operation system is informed to start and execute a shutdown process.

5. A mobile terminal comprising a battery, and also comprising:

a memory storing programming instructions; and a processor configured to execute the stored programming instructions to perform steps comprising:

reading a register of a coulometer chip for acquiring a first power of the battery;

matching the first power with at least one preset power level, respectively, each of the at least one power level corresponding to a preset service logic;

correcting the first power by a preset service logic matched with the first power to form a second power and displaying the second power;

wherein the forming the second power comprises: reading the register of the coulometer chip for acquiring a first voltage of the battery when the first power is at a lowest level of the at least one power level; filtering the first voltage to form a second voltage; and correcting the first power using the second voltage to form the second power;

wherein the reading the register of the coulometer chip for acquiring the first voltage of the battery when the first power is at a lowest level of the at least one power level comprises: reading the first voltage of the battery consecutively, sorting values of various first voltages, removing a largest value and a smallest value, averaging remaining values, and taking a mean value as a value of the second voltage.

6. The mobile terminal according to claim 5, wherein the preset service logic matched with the first power comprises service logic 1 to 4, wherein:

service logic 1 represents that: if the first power 1 (C1) ≥100%, the first power being at power level 1, then the second power (C2)=100%;

service logic 2 represents that: if 100%>the C1≥30%, the first power being at power level 2, then the C2=(50+((C1*100−30)*5)/7)%;

service logic 3 represents that: if 30%>the C1≥7%, the first power being at power level 3, then the C2=(14+((C1*100−7)*35)/22)%; and service logic 4 represents that: if 7%>the C1≥2%, the first power being at power level 4, then the C2=((C1*100*13)/6)%.

7. The mobile terminal according to claim 6, wherein the preset service logic matched with the first power also comprises service logic 5, which represents that:

when the first power is lower than or equal to 2%, and when the first power is at the lowest level, if a second voltage is higher than a voltage threshold, then the C2=1%, if a second voltage is not higher than the threshold, then the C2=0% and an operation system is informed to start and execute a shutdown process.

* * * * *